United States Patent
Miller et al.

(10) Patent No.: US 6,251,488 B1
(45) Date of Patent: Jun. 26, 2001

(54) PRECISION SPRAY PROCESSES FOR DIRECT WRITE ELECTRONIC COMPONENTS

(75) Inventors: W. Doyle Miller; David M. Keicher; Marcelino Essien, all of Albuquerque, NM (US)

(73) Assignee: Optomec Design Company, Albuquerque, NM (US)

( * ) Notice: Subject to any disclaimer, the term of this patent is extended or adjusted under 35 U.S.C. 154(b) by 0 days.

(21) Appl. No.: 09/305,985

(22) Filed: May 5, 1999

(51) Int. Cl.⁷ ........................................................ B05D 1/06
(52) U.S. Cl. ..................... 427/596; 427/597; 427/561; 427/568; 427/554; 427/96
(58) Field of Search .................... 427/596, 597, 427/561, 568, 554, 422, 96

(56) References Cited

U.S. PATENT DOCUMENTS

| | | | |
|---|---|---|---|
| 4,269,868 | * 5/1981 | Livsey | 427/53.1 |
| 4,323,756 | 4/1982 | Brown et al. | 219/121 LF |
| 4,947,463 | * 8/1990 | Matsuda et al. | 219/121.85 |
| 5,043,548 | 8/1991 | Whitney et al. | 219/121.48 |
| 5,182,430 | 1/1993 | Lagain | |
| 5,208,431 | 5/1993 | Uchiyama et al. | 219/121.65 |
| 5,378,508 | * 1/1995 | Castro et al. | 427/556 |
| 5,449,536 | * 9/1995 | Funkhouser et al. | 427/597 |
| 5,486,676 | 1/1996 | Aleshin | |
| 5,607,730 | * 3/1997 | Ranalli | 427/512 |
| 5,612,099 | * 3/1997 | Thaler | 427/565 |
| 5,733,609 | * 3/1998 | Wang | 427/561 |

FOREIGN PATENT DOCUMENTS

| | | |
|---|---|---|
| 0 331 022 A2 | 2/1989 | (EP) . |
| 0 444 550 A2 | 2/1991 | (EP) . |

* cited by examiner

Primary Examiner—Timothy Meeks
Assistant Examiner—Jennifer Kolb
(74) Attorney, Agent, or Firm—Cary Gray

(57) ABSTRACT

This invention combines the precision spray process with in-flight laser treatment in order to produce direct write electronic components. In addition to these components, the process can lay down lines of conductive, inductive, and resistive materials. This development has the potential to change the approach to electronics packaging. This process is revolutionary in that components can be directly produced on small structures, thus removing the need for printed circuit boards.

38 Claims, 10 Drawing Sheets

PRECISION SPRAY PROCESSES FOR DIRECT WRITE ELECTRONIC COMPONENTS

FIELD OF THE INVENTION

This invention combines precision spray processes with in-flight laser treatment in order to produce direct write electronic components and for other direct material applications. Apparatus for performing invention processes are also provided.

BACKGROUND

Recent developments in the microelectronics industry have allowed commercial integrated circuit (IC) chip manufacturers to achieve a very high packing density within a single IC chip. Submicron features can now be produced on a regular basis. Although the IC industry has gone through revolutionary changes in packing density and device performance, the electronics packaging industry has not seen the same degree of size reduction. One reason for this difference lies in the need to use discrete passive and active electronic devices on circuit boards as well as electrical interconnections to obtain fully functioning IC devices. Since each of the discrete devices must be placed onto the circuit board and bonded in place, various physical constraints dictate the size that the circuit board must maintain.

A variety of methods have been developed for depositing layers of materials onto each other. One method used for depositing metal layers onto other metal substrates is known as laser cladding. In this process, a metallic substrate is used as a deposition surface. A laser is then used to create a molten puddle on the surface of the deposition substrate and the cladding material is fed into the molten puddle in either wire or powder form. The cladding material is consumed in the molten metal puddle and forms the cladding layer. In this fashion, a wear-resistant surface can be applied to a ductile material or an object can be built through sequential layer deposition methods. Due to the relatively high heat input and localized heating of laser cladding processes, the cladding operation is primarily limited to more ductile metallic materials. When this process is applied to materials that are sensitive to thermal shock, catastrophic failure of the deposited material or substrate materials generally occurs.

U.S. Pat. No. 4,323,756 discusses a method similar to cladding for depositing layers of materials onto each other. This method produces rapidly-solidified bulk articles from metallic feedstock using an energy beam as a heat source to fuse the feedstock onto a substrate. Repeated layers are deposited in order to arrive at a three-dimensional finished product. However, the use of a laser to melt the substrate creates excessive heat in the part, causing distortion and residual stress within the part being made. Also, the high energy level required of a laser suitable for this method causes inefficiencies throughout the system.

Another method used for depositing materials is known as the thermal spray process. This process also deposits new material onto a substrate. The materials to be deposited are melted and sprayed onto the deposition surface in droplet form. The deposition material can be supplied in either powder- or wire-form, and is fed into a heated region to be melted. As the materials are melted, a gas stream causes the materials to be directed at the deposition surface at some velocity. The gas can serve to aid in the formation of the droplets. These droplets then form a large diverging jet of molten material that can be used to coat a large area of a particular substrate. One of the limitations of the thermal spray process is in its lack of ability to produce fine features, such as those produced by laser cladding processes. However, there are also advantages provided by the thermal spray process. Since there is little substrate heating, residual stress within the deposited layers is not as significant as that which occurs during the laser cladding process. In addition, as the molten particles solidify they are still spreading out due to the kinetic energy of the particle. This energy can, in effect, serve to counter the residual stress in the part since the energy due to spreading will be in the opposite direction as that due to residual stress. Due to the reduced residual stress, which occurs during the thermal spray process, a much broader range of materials can be deposited. This includes depositing ceramics, plastics, metals and carbides onto dissimilar material surfaces.

The use of nozzles in thermal/plasma spray processes has added certain advantages to these processes; however, the disadvantage of inability to produce fine features remains. U.S. Pat. No. 5,043,548 describes a laser plasma spraying nozzle and method that permits high deposition rates and efficiencies of finely divided particles of a wide range of feed materials. This system uses powdered materials that are carried to the interaction regions via a carrier gas and lasers to melt these particles. However, this system relies solely on the use of a laser created plasma to melt the particles before they are ever introduced to the deposition region. In fact, the carrier gas is often a mixture which promotes ionization and, as such, the formation of a plasma. The formation of a plasma results in melting of the powder particles before they ever come into contact with the deposition substrate. In addition, the beam is diverging such that when it does impact the deposition substrate, the beam irradiance is sufficiently low so that no melting of the deposition substrate occurs. A great distance between the focal point of the laser and the central portion of the plasma is maintained to prevent the substrate from melting. This distance, ranging from 1–6 inches, is a characteristic of this method. The materials are deposited in either a liquid or gaseous state. This design provides a unique method for coating parts; however, it has never been intended for fabrication of multi-layered parts. Due to the diverging nature of the powder material, this plasma technique fails to provide the feature definition necessary for fabricating complex, net-shaped objects.

The laser spraying process is yet another method for depositing layers of materials onto each other. U. S. Pat. No. 4,947,463 describes a laser spraying process in which a feedstock material is fed into a single focused laser beam that is transverse to a gas flow. The gas flow is used to propel the molten particulate material towards the surface onto which the spray deposition process is to occur. In this patent, use of a focused laser beam to create a high energy density zone is described. Feedstock material is supplied to the high-energy density zone in the form of powder or wire and carrier gas blows across the beam/material interaction zone to direct the molten material towards the surface onto which the spray process is to deposit a film. One critical point of the '463 patent is that it requires the high energy density zone created by the converging laser to be substantially cylindrical. Realizing that efficient melting of the feedstock material is related to the interaction time between the focused laser beam and the feedstock material, '463 also describes projecting the feedstock material through the beam/material interaction zone at an angle off-normal to the beam optical axis. This provides a longer time for the material to be within the beam and increases the absorbed energy. Also, this method primarily controls the width of the deposition by varying the diameter of the carrier gas stream, which provides variation on the order of millimeters. Although this resolution is adequate for large area deposition, it is inadequate for precision deposition applications.

U. S. Pat. No. 5,208,431 describes a method for producing objects by laser spraying and an apparatus for conducting the method. This method requires the use of a very high-powered laser source (i.e., 30 to 50 kW) such that instantaneous melting of the material passed through the beam can occur. The high laser power levels required by '431 a necessary because the laser beam employed in the process is not focused. As such, a very high-powered laser source is required. In fact, this process is essentially limited to $CO_2$ and CO lasers since these lasers are the only sources currently available which can generate these power levels. These lasers are very expensive and, as a result, limit application of this method.

The spray processes provide another approach to applying a broad range of materials to substrates of similar or dissimilar composition in order to create thin films of material. However, there exists a need for improved geometric confinement of the materials streams in order to provide a technology platform on which to build a means to directly fabricate interconnected active and passive electronic components onto a single substrate, thereby achieving an integrated solution for electronic packaging.

OBJECTS OF THE INVENTION

Accordingly, there are several objects and advantages of the present invention, including:

(a) eliminating discrete electronic components through development of a technology that allows electrical components to be fabricated onto any substrate;

(b) depositing electronic components with no post-processing;

(c) creating passive and active electronic components that can be integrated onto any substrate;

(d) conformably integrating electronic components onto any substrate;

(e) providing a process that does not require masks; (f) fabricating electronic components onto heat sensitive substrates; (h) eliminating the need to use printed wire boards; and (i) providing the ability to fabricate functional micro-scale and meso-scale electronic circuits.

These and other objects and advantages of the invention will become apparent upon review of the specification and appended claims.

BRIEF DESCRIPTION OF THE INVENTION

According to the present invention, there are provided methods for direct material deposition onto a deposition substrate, by aiming a feedstock at the deposition substrate and treating the feedstock in-flight by passing it through a laser beam. Through computer control and computer aided design (CAD) models, a complete circuit, including passive and active devices, can be patterned onto a variety of materials including an IC component package itself. Through definitions within the CAD software, representations for the various electronic components can be defined to dictate which materials need to be applied and in what sequence these materials need to be applied.

To compliment the advances achieved in the IC industry, a revolutionary approach has been developed to allow both passive and active electronic devices to be directly produced in a fashion similar to those methods used in the IC industry. The approach presented in this invention provides such a method, in which the traditional circuit board can be eliminated and the passive and active electronic components can be directly placed on various substrates. Through the use of a multi-material deposition process these passive and active devices can be deposited directly onto a substrate a layer at a time in a controlled pattern providing a complete method to substantially reduce the complete electronic package size. Creating an entire electronic structure using the present invention is quite unique. This technology will indeed provide the revolutionary change that is required to produce order of magnitude changes in the size of electronic packaging, well beyond that which is available with discrete components and printed circuit boards.

DETAILED DESCRIPTION OF THE INVENTION

Figure 1:
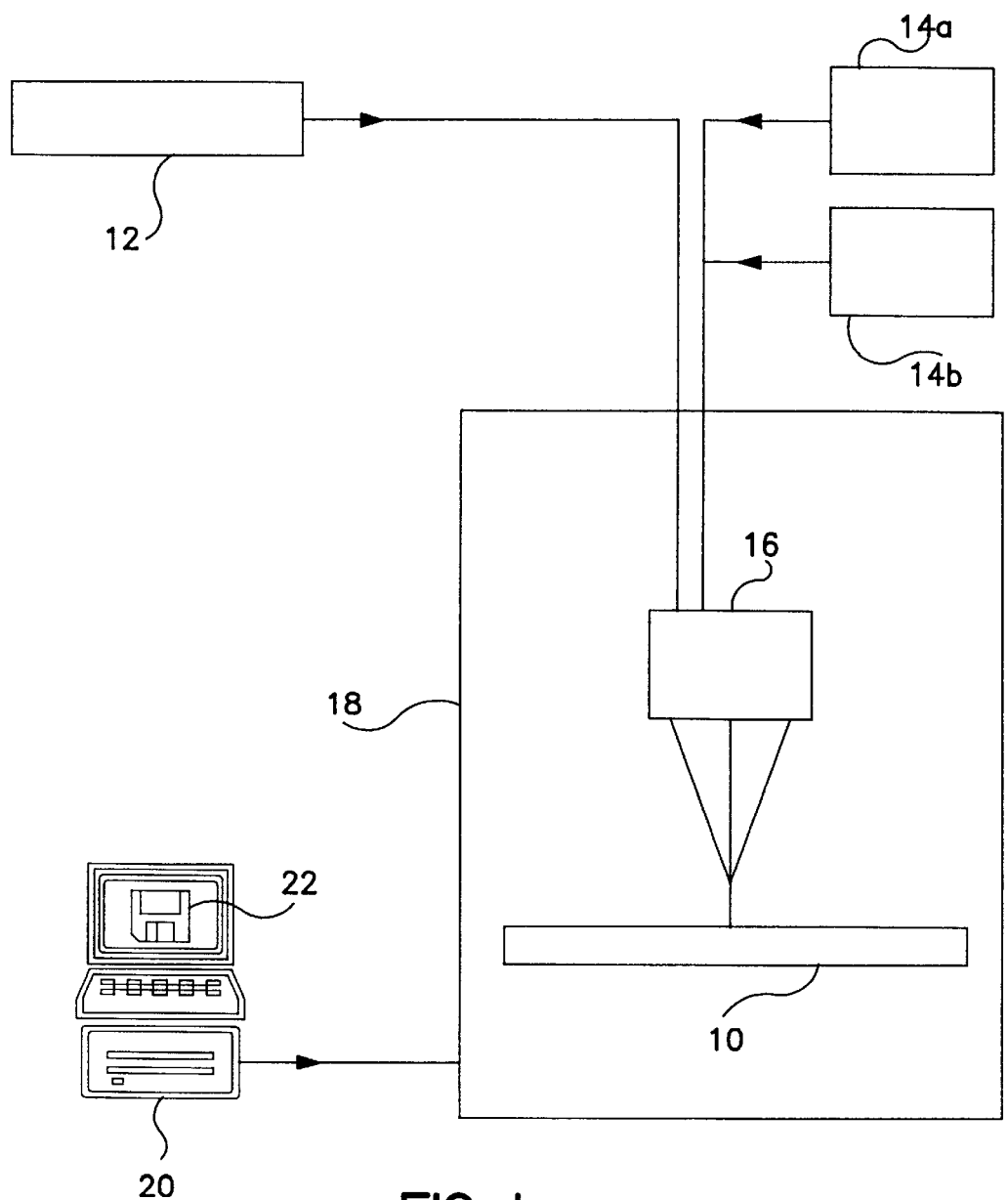
FIG. 1 schematically illustrates the position of the present invention within a material deposition system.

In accordance with the present invention, there are provided methods for direct material deposition on a substrate, said methods comprising:

(a) passing one or more feedstocks through a laser beam under conditions sufficient to convert substantially all of said feedstock(s) into a depositable form, and (b) depositing said depositable feedstock(s) on said substrate, wherein said laser beam is generated by at least one laser, each operating at a power in the range of about 1 mW up to about 1 kW.

In accordance with another embodiment of the present invention, there are provided methods for direct material deposition on a substrate, said methods comprising:

(a) passing one or more finely divided feedstocks through one or more laser beams under conditions sufficient to convert substantially all of said feedstock(s) into a depositable form, and (b) depositing said depositable feedstock(s) on said substrate, wherein said finely divided feedstock comprises feedstock particles of less than about 40 µm in diameter.

In accordance with still another embodiment of the present invention there are provided methods for direct material deposition on a substrate, said methods comprising:

(a) passing one or more feedstocks through one or more laser beams under conditions sufficient to convert substantially all of said feedstock into a depositable form, and (b) depositing said depositable feedstock on said substrate, wherein said method is capable of achieving a fine line resolution of less than about 250 µm. Typically, resolutions achieved in the practice of the present invention fall in the range of about 0.1 µm up to about 250 µm. In a presently preferred embodiment, resolution of less than about 25 µm is obtained.

In accordance with yet another embodiment of the present invention, there are provided methods for direct material deposition on a substrate, said methods comprising:

(a) passing one or more feedstocks from a feedstock source through one or more laser beams under conditions sufficient to both convert substantially all of said feedstock(s) into a depositable form, and to guide said feedstock(s) into one or more hollow fibers disposed between said feedstock source and said substrate, and (b) depositing said depositable feedstock(s) on said substrate.

Substrates suitable for use in the practice of the present invention include those typically employed in the integrated circuit field, such as metals, plastics (i.e., polymer resins, thermosets, and the like), glass, composites, ceramics, and the like.

Feedstocks contemplated for use in the practice of the present invention include a wide variety of elemental and molecular materials (or precursors thereof) in a number of forms, including, solid, liquid, powder, gel, suspension, solution, aerosol, fine mist, and the like. Accordingly, in one embodiment of the present invention, feedstock material is in a finely divided particulate form. In another embodiment of the present invention, feedstock material is provided in a substantially liquid form. Similarly, the feedstock may be supplied with one or more carrier systems. For example, powdered feedstock may be used as a colloidal suspension in a liquid. In the latter embodiment, the liquid carrier may be vaporized or decomposed upon passage of the feedstock through the laser beam(s). In yet another embodiment of the present invention, liquid feedstock material comprises a solution of a desired feedstock material in a solvent. In this embodiment, the solvent may decompose or be vaporized during passage of feedstock material through the laser beam(s), thereby resulting in deposition of substantially pure feedstock material.

When powdered (i.e., finely divided) feedstock materials are used in the practice of the present invention, the size of the particles of which the powder is composed may vary infinitely, dictated only by the level of detail required in the deposited material and the energy required to melt the particle or otherwise impart sufficient energy to the particle to render it depositable on the chosen substrate. The smaller the particle, the less energy required to render it depositable. In addition, greater resolution is achievable with finer particles. Accordingly, powder feedstock material contemplated for use in the practice of the present invention comprises particles in the range of about 0.05 µm up to about 40 µm.

As will be understood by those of skill in the art, the "depositable form" of a feedstock material may vary according to the feedstock material used, the number of feedstocks applied, the substrate material, and the like. Accordingly, in one embodiment of the present invention, the depositable form of feedstock material will be a heated feedstock. The heating will occur due to energy being imparted by the laser beam(s) through which the feedstock passes immediately prior to its deposition on the substrate. In a more desirable embodiment, the feedstock will have sufficient energy imparted thereto so that it is softened (e.g., when feedstocks such as glass, and the like are employed). In an even more desirable embodiment, the feedstock will have sufficient energy imparted thereto so that it is heated above the latent heat of fusion for the particular feedstock employed. In a presently preferred embodiment, the feedstock will have sufficient energy imparted thereto by the laser beam(s) so that it is rendered molten prior to impact with the substrate.

Feedstock may also be provided in the form of feedstock precursors. Accordingly, in another embodiment of the present invention, the laser energy heats one or more feedstock precursors resulting in a chemical conversion of the feedstock precursor to a depositable form.

Figure 6:
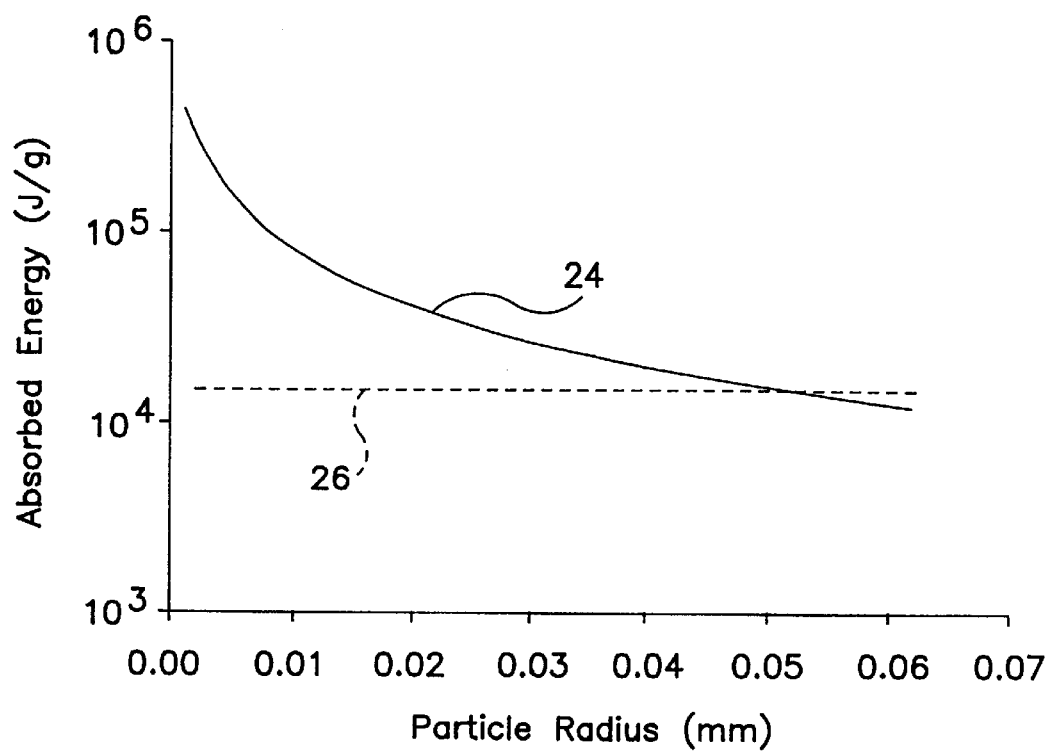
FIG. 6 graphically depicts the absorbed particle energy for a nickel-based alloy vs. particle radius.
Figure 7:
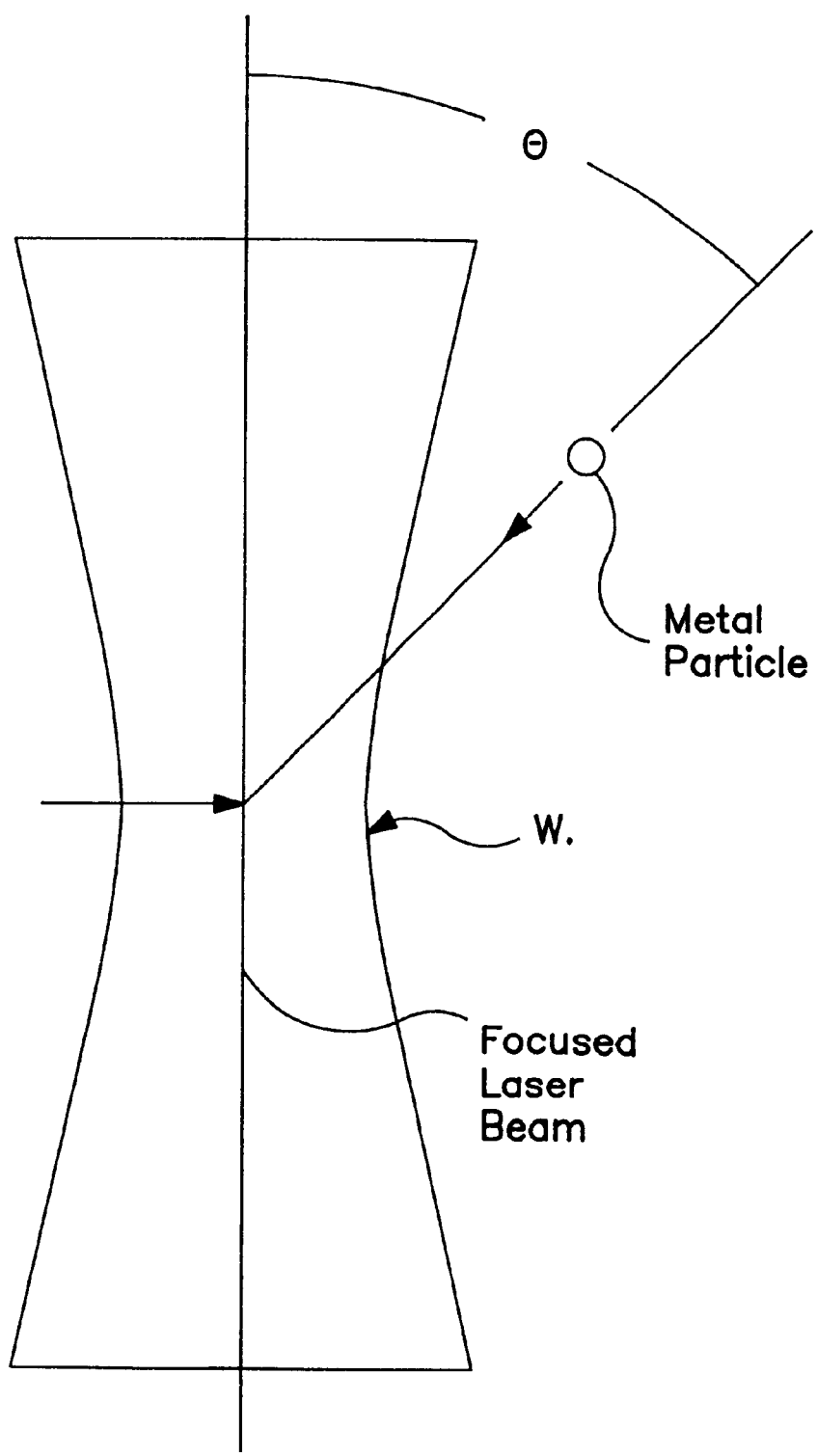
FIG. 7 provides a depiction of feedstock powder entering a laser beam at an angle ($\theta$), wherein the laser beam is normal to the surface of the deposition substrate surface.

The energy imparted to a given particle of feedstock can be readily determined by those of skill in the art. For example, calculations can be performed by making the following assumptions (which do not necessarily apply to all embodiments of the present invention): (1) the laser irradiance is constant over the diameter of the beam; (2) the particle area of absorption is represented by the cross-sectional area of the particle; (3) the absorption is constant across this area and is independent of the angle of incidence; (4) the particle passes through the center of the laser beam; (5) the beam diameter does not change in the region of the beam the particle passes through; and (6) the absorption of the particle does not change with time or temperature. The time of flight ($t_f$) of the particle through the laser beam can be determined from equation (I) as follows:

$$t_f = \frac{2w_0}{v_p \sin\theta} \quad \text{(I)}$$

where $w_o$ is the laser beam radius at the focal point of the beam, $v_p$ is the feedstock particle velocity and $\theta$ is the angle of trajectory of the feedstock particle with respect to the laser beam axis. The energy imparted by the laser beam to the particle is derived by taking the ratio of the area of the particle to the area of the laser beam and then multiplying this quantity by the laser power and the time of flight of the particle through the beam, as given by equation (II) as follows:

$$E_p = \frac{P_l r_p t_f \alpha}{w_0^2} \quad \text{(II)}$$

where $P_l$ is the laser power in watts, $r_p$ is the radius of the particle in mm and $\alpha$ is the absorption of the particle. A graphic depiction of absorbed particle energy 24 for a nickel-based alloy vs. particle radius is shown in FIG. 6, where the absorbed energy is compared to the latent heat of fusion 26 of the alloy, demonstrating how crucial particle radius is to providing for the desired level of energy to be imparted to finely divided feedstock materials. Equation I indicates that the energy absorbed by a feedstock particle is directly proportional to the time of flight ($t_f$) of the particle through the laser beam. Accordingly, by adjusting parameters to maximize the in-laser $t_f$ of feedstock particles, the energy imparted to the feedstock particles is enhanced. Equation I also demonstrates that in-laser $t_f$ can be increased by a number of means including one or more of reducing particle velocity ($v_p$), decreasing the angle of incidence ($\theta$) of the particle to the laser, increasing the radius of the laser beam at the focal point, and the like. FIG. 7 provides a depiction of feedstock powder entering a laser beam at an angle ($\theta$), wherein the laser beam is normal to the surface of the deposition substrate surface.

As will be further understood by those of skill in the art, energy will be imparted to the substrate from the energy contained in the laser-treated feedstock material. As a result, care should be taken to avoid overheating of the substrate which could cause interfacial damage (i.e., surface modification) due to residual stresses caused by any number of factors, including differential thermal coefficients of expansion between the substrate and feedstock, different melting temperatures of feedstock materials, and the like. Accordingly, in a presently preferred embodiment of the present invention, sufficient energy is imparted to the feedstock in-flight to render the feedstock depositable and promote adhesion to the substrate without causing significant interfacial damage of the substrate or deposited feedstock. Thus, a function of invention methods is to provide a means to efficiently render depositable the additive materials (i.e., feedstock) being applied to a substrate while only providing sufficient peripheral heating of the substrate to facilitate adhesion without a significant level of surface modification. In this approach several advantages will be realized. For example, residual stress will be minimized, and thus, a broader range of materials can be deposited onto dissimilar materials.

As demonstrated by the foregoing equations and discussion, the energy imparted to feedstock and subsequently to the substrate can be varied by changing the laser beam radius at the focal point of the beam, the feedstock particle velocity, the angle of trajectory of the feedstock particle with respect to the laser beam axis, the laser power, the time of flight of the particle through the beam, and the like.

Virtually any material suitable for laser heating (i.e., will not be destroyed by the process) can be employed as a feedstock in the practice of the present invention, depending on the intended application. Accordingly, in one embodiment of the present invention the feedstock material is a dielectric material such as barium titanate, silicon dioxide, and the like. In other embodiments of the present invention, the feedstock material is a resistive materials such as a ruthenates, a metal dielectric composite (e.g., silver+barium titanate, and the like), and the like; a conductive material such as silver, copper, gold, and the like; a semi-conductive material such as silicon, germanium, galium nitride, and the like; a magnetic material such as MnZn and FeZn, and the like; a ceramic (e.g., alumina, zirconium diboride, and the like), a cermet, and the like.

Those of skill in the art will recognize that use of more than one feedstock material will result in greater varieties of finished components formed by invention methods. Accordingly the present invention also contemplates methods wherein a plurality of feedstock materials is employed. Similarly, a single feedstock may be employed in a stepwise fashion or multiple feedstock materials may be applied sequentially. Therefor, the present invention encompasses methods wherein feedstock material is deposited in a layerwise and/or sequential fashion to create structures and components with desired performance and physical characteristics.

As will be recognized by those of skill in the art, given the variety of feedstock materials contemplated for use according to the present invention, feedstock mixtures composed of materials with different melting points may be employed. Accordingly, in one embodiment of the present invention, the feedstock material is in a substantially liquid phase upon impact with said substrate. In another embodiment of the present invention, upon impact on said deposition substrate, a subset of the feedstock materials is not liquid (i.e., molten), while another portion or subset of the feedstock materials is liquid. In yet another embodiment of the present invention, the liquid phase feedstock material interacts with non-liquid feedstock material causing aggregation of non-liquid feedstock material(s).

Energy requirements for precision spray processes of the present invention are reduced as compared to conventional laser deposition processes, therefor a unique opportunity is afforded to move away from the typical materials processing lasers, such as Nd:YAG and $CO_2$ lasers, towards diode laser technology. Although lasers such as Nd:YAG and $CO_2$ lasers are contemplated for use in the practice of the present invention, a significant advantage can be gained through the use of solid state diode laser technology. Accordingly, such solid state diode lasers are also contemplated for use in the practice of the present invention. One advantage of diode lasers is gained from the energy efficiency they provide (i.e., on the order of 30%–50% over non-diode lasers). Lasers contemplated for use in the practice of the present invention will typically have energies in the range of about 1 mW up to about 1 kW. Although higher laser energies may be employed in the practice of the present invention, they are not required for most applications. Another advantage gained from the use of diode lasers is the ease with which these devices can be controlled. Since diode lasers are solid state devices, these lasers can be directly integrated into a closed-loop control circuit and provide a very fast response time that is not typically available with other high-powered lasers. Finally, the compact size of the diode laser provides the ability to use multiple lasers within a confined space to increase the material deposition rate.

Invention methods are useful for forming or fabricating an almost limitless variety of articles wherein controlled deposition of a material onto a substrate in a predetermined pattern is required. Such applications are particularly numerous in the electronics and micro-electronics fields. Therefor, in order to achieve deposition of materials in a predetermined pattern, in one embodiment of the present invention, there are provided methods wherein the laser exposed feedstock material can be controllably aimed at the deposition substrate. As will be understood by those of skill in the art, controllable aiming can be accomplished by providing relative motion between the feedstock stream and the deposition substrate, as well as by varying such parameters as laser power, laser aiming, feedstock metering, atmosphere control, and the like. Controllable aiming of feedstock material can be accomplished by a variety of techniques including analog or digital computer control, programmable logic controller control, manual control, and the like. In accordance with one embodiment of the present invention, feedstock is controllably aimed by passing a charged powder feedstock material through one or more electrostatic fields and/or magnetic fields. In this manner, the electric or magnetic field can be used to both confine a particle stream to the desired area of the laser beam, and/or to direct the particle stream to the desired area of deposition.

In accordance with another embodiment of the present invention, digital computer controlled aiming can be augmented by the use of computer-aided-design (CAD) programs and data sets. Virtually any parameter of invention methods can be controlled via data from a CAD file. Indeed, a CAD file and/or other stored information file can provide information to direct control of any of the parameters that need to be varied in order to achieve the desired level of aiming control. For example, information can be provided to change the relative position of the feedstock stream to the deposition substrate by directing movement of the substrate relative to the feedstock stream and/or by directing movement of the feedstock stream relative to the substrate. Thus, process parameters such as laser power, laser aiming, translation of the substrate in relation to the deposition head, choice of feedstocks, feedstock metering, atmosphere control, and the like can be provided by one or more files of electronically stored information.

Due to the level of precision obtainable with computer controlled manufacturing, in accordance with one embodiment of the present invention, there are provided methods for the direct writing of electronic components. In this embodiment, aiming is controlled to provide for the direct write of an interconnected circuit pattern, including individual electrical components, using data provided in an electronic format such as a CAD file, and the like. Similarly, in accordance with another embodiment of the present invention, direct write electronic components are created by depositing in a layerwise fashion to create multilayer componentry as well as single components with multiple materials. For example, a dielectric feedstock material can be sandwiched in between two conductive layers to create a capacitor. Of course other types of components and objects can also be created by employing multiple feedstocks in the practice of the present invention.

When multiple feedstock deposition processes are employed, feedstock supply material can be interchanged between deposition sequences. For this embodiment, the feedstock materials are stored or contained in individual containers (e.g., hoppers) that can be indexed, such that the feedstock exiting from the container is aligned with the desired portion of the laser beam(s) (generally the focus spot). In accordance with the present invention, feedstock is projected towards the deposition surface by any suitable means including vibration, gravity feed, electrostatic acceleration with piezoelectric transducers, light energy (i.e., exploiting the potential well effect), and the like, as well as a combination of these methods. The presently preferred method for projecting the feedstock towards the deposition substrate is by means of a non-reactive carrier gas such as nitrogen, argon, helium, and the like. The interchange of feedstock materials can occur through several methods, including the direct replacement of individual hoppers, nozzle sets, and the like.

As will be understood by those of skill in the art, certain applications of invention methods (e.g., the direct writing of electronic components, and the like) will require very fine feature definition. Although features having widths of several hundred microns can be generated employing invention methods, invention methods can provide fine line resolution down to about 0.10 $\mu$m, or less. A number of features of the present invention contribute to the high resolution obtainable herein. Accordingly, in accordance with one embodiment of the present invention, fine line resolution is achieved by using a plurality of laser beams having an intersection region. By adjusting the power of the lasers so that only the intersection region imparts sufficient energy to render feedstock depositable, the desired line resolution can be achieved by providing a focused laser beam intersection region of approximately the desired resolution. Only those feedstock particles passing through the intersection region are thereby sufficiently energized to be deposited. In accordance with another embodiment of the present invention, the stream of feedstock material delivered to the laser beam is kept to a diameter that does not exceed the desired resolution.

In accordance with another embodiment of the present invention, control over feature resolution employs the use of piezoelectric driven micro pumps and electric and magnetic fields. Feedstock particles are charged and then projected toward the deposition surface through the use of electrostatic fields. The direction of the particles can be controlled using a magnetic field that is transverse to the direction of the particle stream; thereby providing for control over both the direction and focus of the particle stream as it is propelled towards the deposition substrate.

In still another embodiment of the present invention, there are provided methods to concentrate and propel particles towards the deposition surface employing an optical transport mechanism. The feedstock particles are irradiated with a laser of suitable power (typically in the range of about 1 mW up to about 1 kW) to cause the particles to be directed into one or more hollow fibers. The total internal reflection provides field confinement within the hollow fiber that then propels the particle stream towards the deposition surface. This method of propulsion is based largely on the scattering of light by the particles. This method also allows very low particle propagation velocities to be obtained thereby substantially increasing the absorption of energy by the particles. Both the electrostatic and optical transport mechanisms overcome particle scattering effects caused by gas flow powder delivery methods as well.

As will be recognized by those of skill in the art, rendering feedstock depositable in-flight is achieved by exposing the feedstock to a laser of sufficient intensity for a sufficient period of time. As will also be recognized by those of skill in the art, increasing the exposure time of the feedstock to the laser will result in a lower laser energy requirement to achieve proper treatment of the feedstock; the converse is also true. Exposure time may be increased by slowing feedstock velocity and/or increasing the area of laser through which the feedstock passes. Therefor, in one embodiment of the present invention, there are provided methods wherein the laser beam(s) possess(es) sufficient energy to render feedstock depositable in-flight. In another embodiment of the present invention, there are provided methods wherein the size of the focus spot of the laser(s) is of sufficient size that the time of flight of feedstock within the laser results in sufficient energy being imparted to feedstock to achieve in-flight melting of feedstock. Depending on the application, the substrate and the feedstock, the diameter of the laser beam at its focal point can be in the range of about 1 $\mu$m up to about 500 $\mu$m. In accordance with the present invention, it has been determined that there is no loss in energy absorbed by the feedstock material if the laser beam(s) is/are elliptically focused. Accordingly, in accordance with one embodiment of invention methods, there are provided methods wherein the size of the focal spot of the laser(s) is increased through elliptical focusing of the laser beam(s).

In some instances it may be desirable to use a plurality of laser beams having a common area of intersection.

Accordingly, in accordance with still another embodiment of the present invention, there are provided methods wherein each of a plurality of focused laser beams has a common area of intersection. In keeping with the idea that elliptically focused laser beams are advantageous for certain applications, in yet another embodiment of the present invention, there are provided methods wherein each of a plurality of laser beams, each having an elliptical cross section, have a common area of intersection (i.e., intersection region). In this and the foregoing embodiment the present invention, it is postulated that due to the fact that, as a given particle of feedstock powder passes through an elliptically focused laser beam there is a longer time of flight within the laser beam than if the beam had a substantially circular cross-section, a higher probability exists that scattered laser energy from one particle will be incident to, and subsequently absorbed by, a second particle.

In accordance with another embodiment of the present invention, the deposition process is carried out inside a sealed chamber to contain the feedstock material during the process and to provide a controlled atmosphere. In a presently preferred embodiment, the atmosphere is an inert gas; however, reducing or oxidizing atmospheres can also be used, especially when the feedstock employed is a precursor to the material to be deposited. Exemplary oxidizing atmospheres include ambient air, oxygen enriched ambient air, $O_2$, and the like. Exemplary reducing atmospheres include $H_2$, fluorine, chlorine, and the like.

The very abrupt transitional interfaces that can be achieved by invention methods provide unique characteristics within the fabricated structures enabling new classes of materials to be created. The very fine feature definition achievable by invention methods allows miniature micromechanical hardware to be fabricated from a broad range of materials. Invention methods provide the opportunity to deposit sacrificial materials to provide a support structure material for direct fabrication processes, enabling a true three-dimensional capability without the complexity of five or six axis positioning.

As recognized by those of skill in the art, invention methods achieve a level of economy and feature resolution previously unattainable in the field. Accordingly, the present invention encompasses articles of manufacture produced by invention methods.

In accordance with another embodiment of the present invention, there are provided apparatus for direct material deposition on a substrate, said apparatus comprising:

(a) a feedstock deposition head comprising one or more feedstock deposition nozzles, wherein said deposition head is adapted to receive feedstock from one or more feeding means and direct said feedstock into said feedstock deposition nozzles, (b) one or more lasers aimed so that a focal point of a laser beam emanating therefrom intersects a path defined by the deposition nozzle(s) and a deposition target on said substrate, (c) a means for controllably aiming said feedstock at said deposition target, and (d) optionally, a moveable substrate stage, wherein said apparatus is capable of achieving a fine line resolution of deposited feedstock of less than about 250 $\mu$m. Typically, resolution in the range of about 0.1 $\mu$m up to about 250 $\mu$m is obtained. In a presently preferred embodiment, resolution of less than about 25 $\mu$m is obtained.

One critical aspect of the present invention is the relatively low laser power required to render or convert feedstock or feedstock precursors to a depositable form. The present invention provides for process conditions that minimize the laser power required. As described herein, process parameters that contribute to the reduced laser power include feedstock flow rate, feedstock particle size, the energy absorbed by feedstock, and the like. Therefor, in accordance with the present invention, the laser(s) employed in the invention methods and included in the apparatus are typically operated at a power level up to about 1 kW, although in some instances higher powers may be required and/or desired. As those of skill in the art will understand, numerous variables including feedstock material, substrate material, and the like, will be determinative of the desired laser power. Accordingly, lasers contemplated for use in the practice of invention methods and included in the apparatus may be operated at power levels in the range of about 1 mW up to about 1 kW. Typically, lasers contemplated for use in the practice of invention methods and included in the apparatus are operated at power levels in the range of about 10 mW up to about 10 W. In a particular aspect of the present invention, lasers contemplated for use in the practice of invention methods and included in the invention apparatus are operated at power levels in the range of about 100 mW up to about 2 W.

As used herein, "deposition head" includes any apparatus suitable for transporting feedstock to one or more feedstock deposition nozzles. Typically, feedstock deposition nozzles will be integral to the deposition head assembly, however other configurations are possible. The deposition head may also include a means for metering and/or dispensing a measured amount of feedstock from the feedstock source to be directed to the nozzles.

Early development of laser based direct material deposition processes focused primarily on creating a molten puddle on a substrate into which a powder or wire material is fed to create a new layer of material. This method can work well for metals where the material being deposited is of a similar composition to the deposition substrate. The material being deposited must be somewhat ductile to accommodate the residual stress caused by this deposition process in each of the layers. Reducing the energy input that causes heating of the substrate and optimizing the energy input that causes the additive material to melt can minimize the stress level. A second method for direct material deposition involves a spray process in which the materials to be deposited are melted and subsequently spray deposited onto a substrate as molten droplets. This method provides the ability to deposit a very broad range of materials; however, the feature definition is generally limited due to the spray pattern. These prior art processes focus on manipulating laser power as the primary means for effecting melting of feedstock materials. Combining the desirable features from these two varying methods provides the basis for the operation of the present invention.

Figure 2:
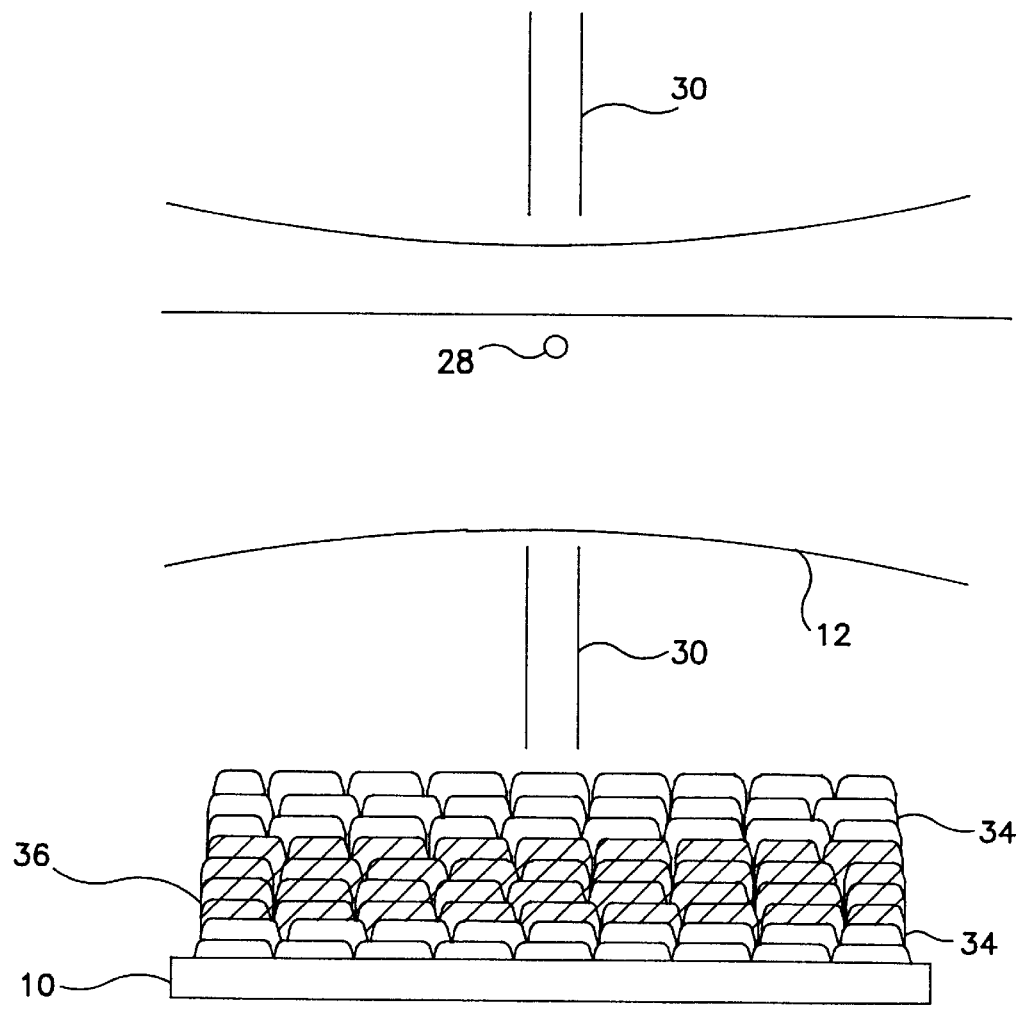
FIG. 2 is a schematic of the process as would be used in a direct write application, using two different types of materials.

One embodiment of the methods and apparatus described herein can be shown by reference to FIGS. 1 and 2. FIG. 1 is a schematic showing an embodiment of a direct material deposition application. In this example, powdered materials are transported to the deposition location by entraining the powder in a carrier gas stream. Other methods that can be used to transport the powder to the deposition region include vibration, gravity feed, electrostatic acceleration with piezoelectric transducers, and the like, as well as combinations of these methods. The powder is first placed in a feeding apparatus 14a, 14b. Providing multiple powder feeding apparatus 14a, 14b, with multiple feedstock materials, allows for a variety of materials to be deposited using a single processing chamber. From the feeding apparatus 14a, 14b, the volumetric flow rate of feedstock is metered using standard powder feeding methods such as screw feed, feed wheel, venturi mechanisms, or the like. When powdered feedstock materials are employed, a vibratory motion generator may be included on the metering system to improve powder flow characteristics by fluidizing the powder and minimizing compacting of the fine powdered materials. The powder supplied by the metering mechanism is entrained in a carrier gas that passes through or near the metering mechanism. The powder containing gas is then directed through a series of tubes and passages to separate the powder into one or more streams of preferably but not necessarily approximately equal volume. It is desirable to minimize the transport distance to avoid settling of the powders within the transport mechanism. From the deposition head 16, the powder is finally ejected from one or more nozzles toward a substrate on which deposition is to occur.

As further depicted in FIG. 1, the deposition process can occur inside a sealed chamber 18 to contain the feedstock during the process and to provide a controlled atmosphere. Generally, the atmosphere is an inert gas; however, reducing or oxidizing atmospheres can also be used. The jet(s) of feedstock then pass through one or more focused laser beams 12 to be converted to depositable form and subsequently be deposited onto the substrate surface. In this embodiment, the relative position between the focused laser beam and the feedstock stream(s) are fixed with respect to each other during the deposition process.

When multiple deposition processes are used, feedstock supplies can be interchanged between deposition process sequences to provide for deposition of multiple materials. For this embodiment, the feedstock materials are stored or contained in individual hoppers that can be indexed, such that the feedstock stream from the hopper is aligned with the laser beam(s) focal point. This interchange can occur through several methods, including the direct replacement of individual hoppers, nozzle sets, and the like.

Relative motion between the deposition substrate and the laser beams/feedstock streams is provided to allow specific patterns of materials to be deposited. Through this motion, materials may be deposited to form solid objects a layer at a time, to provide a surface coating layer for enhanced surface properties, to deposit material in a specific pattern for various applications, and the like. Computer 22 is a preferred method to control this motion since this enables the process to be driven by CAD software 20, or the like.

Continuing with the description of a particular embodiment of the invention, FIG. 2 depicts the process that occurs in the deposition area After being ejected from one or more nozzles, the feedstock 28 follows the trajectory path 30 into the laser beam 12. If one assumes a spherically shaped particle 28, the volume of the particle varies as the cube of the radius of the particle. As such, the energy required to render the particle depositable also varies in a similar fashion. This relationship can be exploited to then cause particles passing through a laser beam to be rendered depositable in-flight rather than upon insertion into a molten puddle on a substrate surface. Thus, as feedstock 28 passes through the focal region of the laser beam 12, the energy imparted to the feedstock causes it to be heated and ultimately rendered depositable in-flight. The depositable feedstock then impacts the deposition substrate 10 where they are bonded to the surface. Since this process is similar to thermal spray processes, it possesses the ability to deposit dissimilar materials onto each other. However, care should be taken to insure that the deposition layer thickness is minimized such that residual stress does not cause failure of the deposited layers.

One critical component of invention in-flight particulate methods lies in the ability, through the use of small-sized particle materials (i.e., less than about 40 $\mu$m), to use much lower laser energy than would normally be required to deposit thin layers of material onto a substrate. One advantage to using small-sized particle materials is their ability to be rendered depositable as they pass through the focused laser beam, thus significantly reducing the heating of the substrate 10 by the laser 12. Most, if not all of the substrate heating and any subsequent melting thereof is provided by the energy retained in the laser-treated particles. Since this amount of energy is relatively low, substrate melting can be limited to interfacial melting; although, bulk substrate melting may still be used with invention methods if desired. As shown in FIG. 2, Material A 34 and Material B 36 have been deposited onto each other to provide an abrupt transition between two dissimilar materials. When the depositable powder droplets impact the substrate surface, the droplet spreads out to form a reasonably flat surface. In some cases, partially melted or porous structures can be created through the control of the energy input to the particles. In another embodiment of invention methods, bonding can occur through mechanical adhesion as the depositable droplets wet the surface and fill the features of a deposition substrate having a rough surface.

Figure 5:
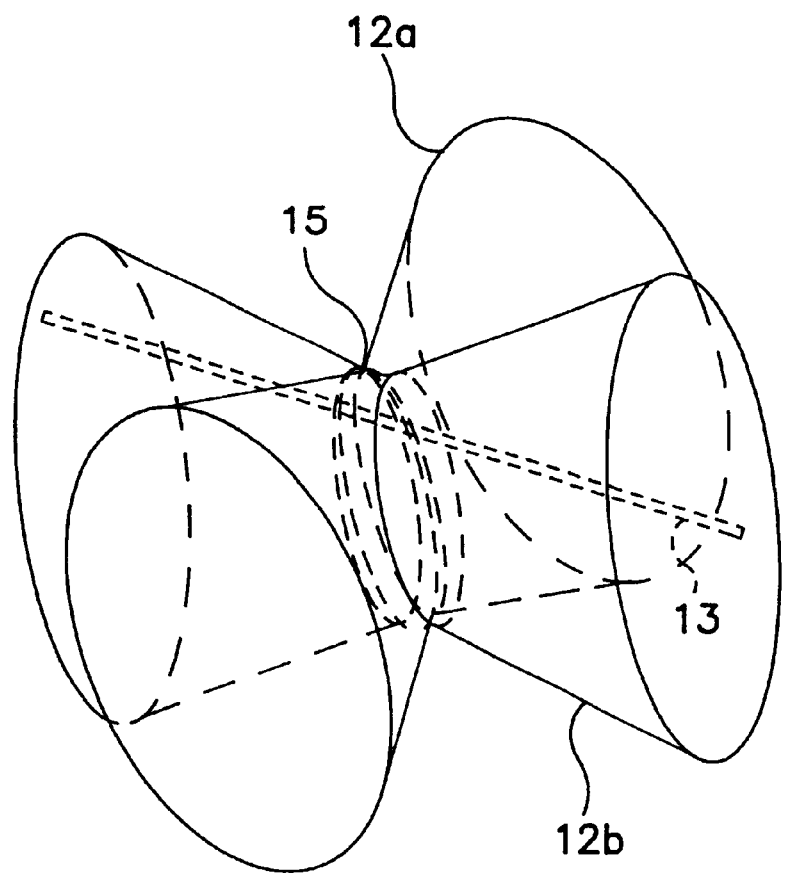
FIG. 5 is a three-dimensional schematic of a set of intersecting focused elliptical laser beams.

In invention embodiments where intersecting laser beams are employed, the intersecting laser beams can be focused to create a cylindrical cross-section for each beam; however, the same energy can be input to the powder particle for an equivalently powered laser whose focused beam cross-section is elliptical. FIG. 5 is a three-dimensional schematic showing two intersecting elliptically focused laser beams 12a, 12b, with the optical axis 13 added as a frame of reference.

The laser beam intersection region 15 shown in FIG. 5 provides an advantage that comes from a longer time of flight path for feedstock material in elliptically focused laser beams. Many of powdered feedstock materials can be highly reflective with only a small fraction of the incident laser energy being absorbed into a particle. As such, a high percentage of the laser power incident onto a particle may be reflected and therefor rendered unavailable to the particle from which it was reflected. This energy is, however, available to other particles that are in the path of the reflected beams. The elliptical beam cross-section provides an increased time of flight for the particles within the laser beam intersection region 15 and, as such, increases the probability that the reflected energy will be incident onto, and subsequently absorbed into neighboring powder particles within the focused beams.

This method will also greatly reduce the use or even eliminate the need to create a molten puddle on the substrate surface. This broadens the range of materials that can be used as deposition substrates. Ceramics and other materials susceptible to thermal shocking due to the large thermal gradient created during the laser aided material deposition process are now candidate materials for use in the practice of the present invention. This technology now approximates a thermal spray process in which energy is stored in molten particles that can be directed onto a broad range of materials without damaging these substrates.

Another advantage offered by the practice of the present invention comes in the form of reduced residual stress contained within the fabricated structures. Laser assisted material deposition processes that rely on substrate melting to cause particles to melt impart sufficient heat into the substrate to cause even thick substrates to be distorted. This effect is reduced as the energy input to the substrate material is reduced. Eliminating the bulk melting characteristics of these processes will significantly reduce this stress. In addition, the impacting characteristics of the depositable particle will behave similarly to thermal spray processes in which shrinkage of the substrate surface is counteracted by outward force due to the particle droplet spreading on impact. In accordance with the present invention, it has been observed that partially melted particles adhere to the surface of components fabricated using current laser assisted material deposition processes. It has also been shown that the particle diameter plays a significant role in the final surface finish of a deposited structure. Since these fine-sized particle materials are typically an order of magnitude smaller in diameter than the materials used in prior art laser assisted material deposition processes; the surface finish due to particle adhesion will be much better.

The present invention can be employed in a number of applications including, for example, the field of flip-chip technology. As packaging size continues to shrink, it is increasingly difficult to apply solder to the points of interconnection. Although solder jetting technologies will work for some intermediate size electronics packages, the direct deposition of solder onto small interconnects is crucial to further miniaturization of packaging. When used for the direct application of solder to interconnects, the present invention will allow solder to be applied to a very small area (on the order of microns). One configuration for flip-chip packages is an array of interconnects located on the bottom of the package. The present invention can be used to apply solder feedstock material to the connectors. In this application, the solder can be provided in finely divided powder form. The solder particles thus provided are very small as compared to the connector pads to which they are to be applied, thereby allowing the connector pad to be considerably reduced in size compared to existing technology. The application of solder bumps that are less than 50 $\mu$m in diameter is achievable with the present invention; as a result the potential exists to significantly increase the packaging density available for microelectronic applications.

Yet another application of the present invention is in the repair of existing electrical hardware such as, for example, flat panel displays, printed circuit for microelectronics, and the like. For the repair application, there may be an existing circuit that has a high value associated with it and yet due to incomplete processing or another event, a flaw is present in the conductor traces. This could be, for example, as shown in FIG. 4*b* in the lower portion of the conductor patterns where there are discontinuous lines. If, in fact, these lines were meant to be connected, the component, as depicted, would be defective. The present invention provides the opportunity to allow the high value component to be saved by depositing a conductive material in a specific pattern between the disconnected conductors such that they become electrically connected.

Another application for the present invention is in the fabrication and deposition of very fine featured metallic patterns. In cellular phone filters, for example, the metallic pattern deposited onto the ceramic filter creates the circuitry for the filtering device. As the frequency of the transmission signal for the phone is increase the feature size becomes more critical. With the fine resolution attainable with the present invention, the metallization of these devices also holds an application for this technology. Repair of contact masks for the microelectronics industry, as well as other like applications are also contemplated applications of the present invention.

As a result of the resolution achievable with the present invention, Micro Electro Mechanical Systems (MEMS), a type of mechanical hardware, can be directly fabricated using the present invention. Although there are clearly defined opportunities for application of the present invention to conventionally sized mechanical hardware, there is also a critical need to provide the ability to fabricate miniature electromechanical hardware from a variety of materials. The resolution provided through the practice of the present invention allows these miniature mechanical components to be produced from a variety of materials. The ability to deposit dissimilar materials provides the opportunity to deposit a sacrificial material as a support structure material, which are removed after the component is fabricated. In addition, materials can be deposited to provide low friction surfaces, wear resistant surfaces, conductive surface, insulating surfaces, and the like.

The invention will now be described in greater detail by referring to the following non-limiting example.

EXAMPLE

Figure 3:
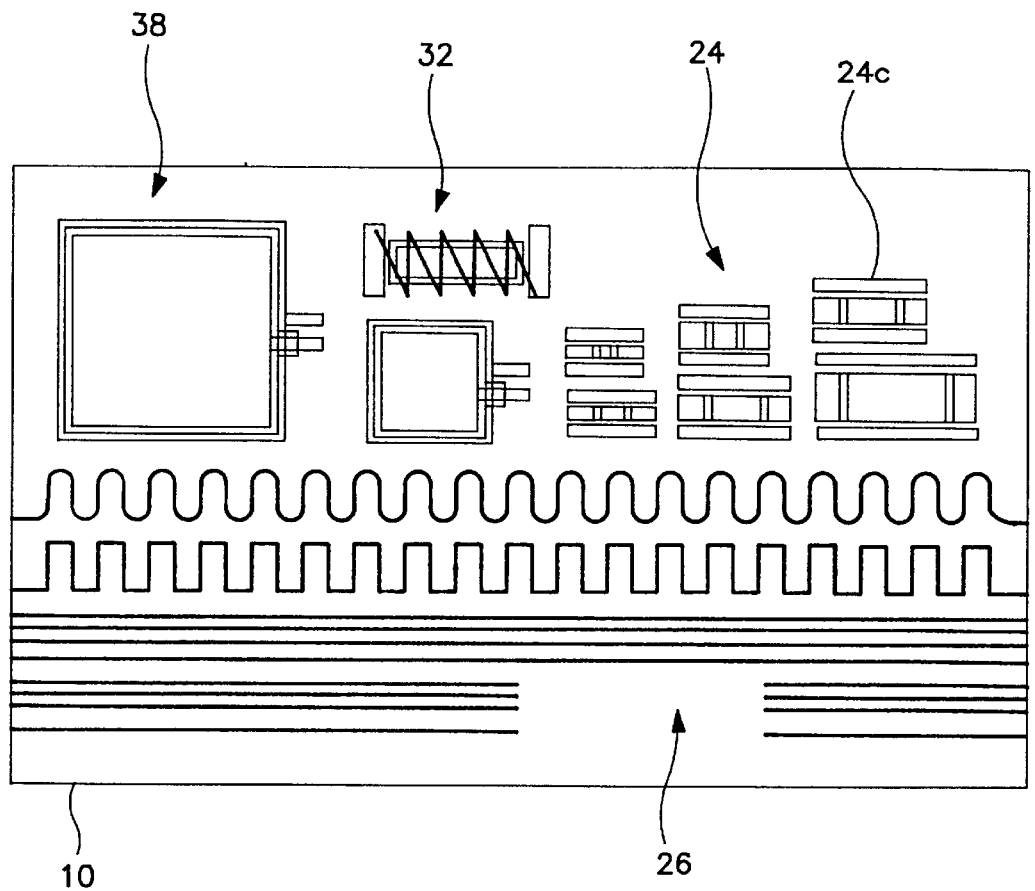
FIG. 3 is a schematic representing a test pattern layout substrate with various passive electronic devices.

There are numerous processing sequences that could effectively be used to create the direct write circuitry contemplated by invention methods. Based on the layout shown in FIG. 3, each of these devices, as well as the conductive lines 26, can be produced using a sequence of steps. An exemplary, albeit basic methodology for sequencing the process to create the circuitry of FIG. 3 is shown in FIGS. 4A–G.

Figure 4A:
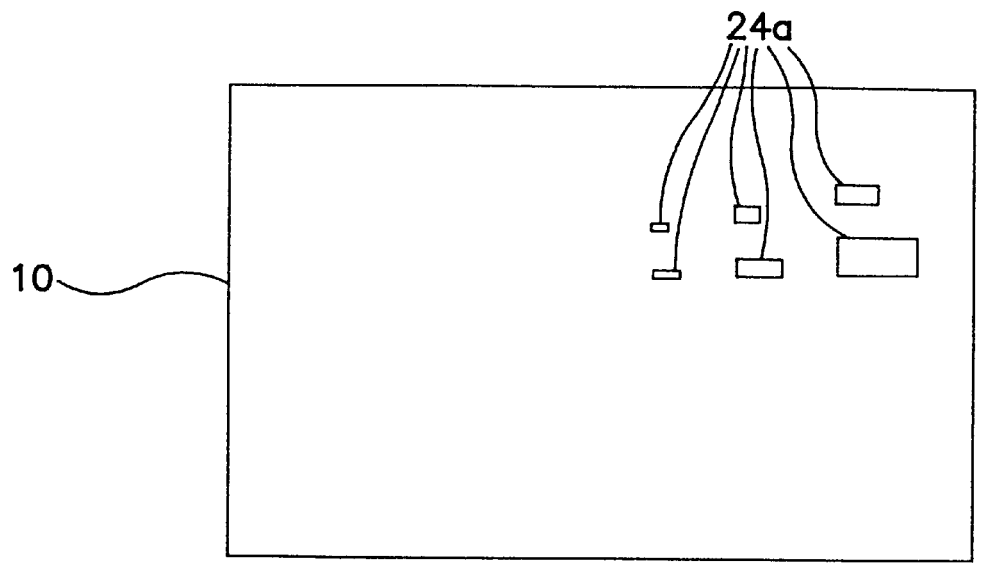
FIG. 4A is a schematic representing the resistive material layer for a direct write electronic process sequence.
Figure 4B:
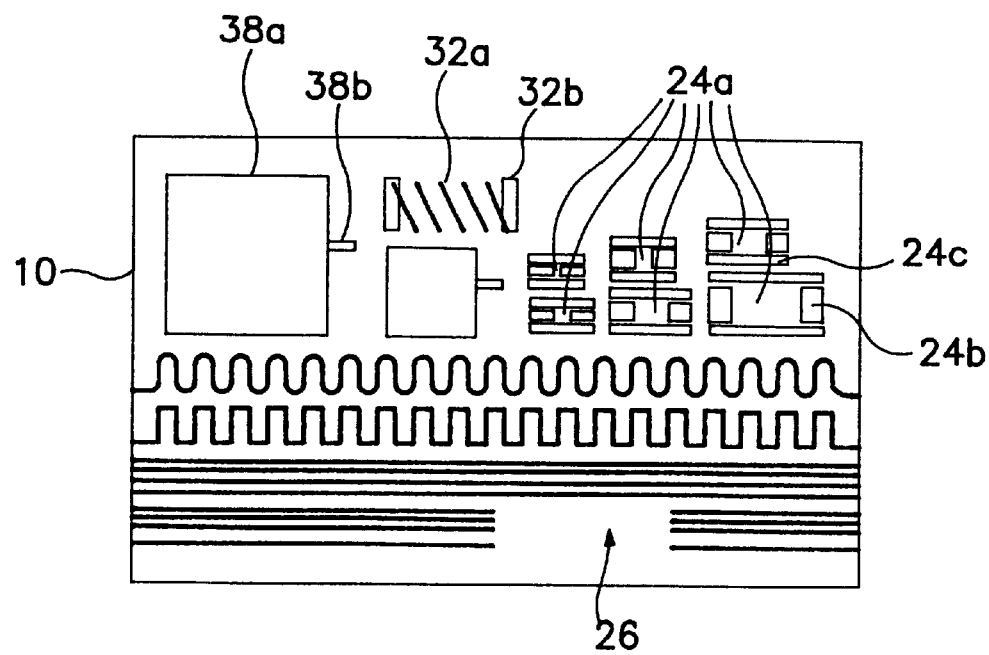
FIG. 4B is a schematic representing the lower conductive layer of the sequence begun in FIG. 4A.

In FIG. 4A, the test substrate 10 is shown with only a resistive material pattern 24*a* applied to the substrate. After the resistive material is applied, the process can be sequenced to then apply a conductive material. The conductive material is usually a metallic material and is used in essentially all of the components.

As shown in FIG. 4B, the conductive lines 26 are deposited in the desired pattern. A conductive material is also used to deposit the lower conductive pattern 38*a* for each of the capacitors, the lower coil conductor pattern 32*a* that serves to form the bottom half of the coil used in the inductive device 32, as well as the inductor component bond pads 32*b*. A conductive material is used to deposit noise reduction conductive pads 24*c*, which are used to shield the resistive material pattern 24*a*. Resistive component bond pads 24*b* are also deposited in order to test each of the devices.

Figure 4C:
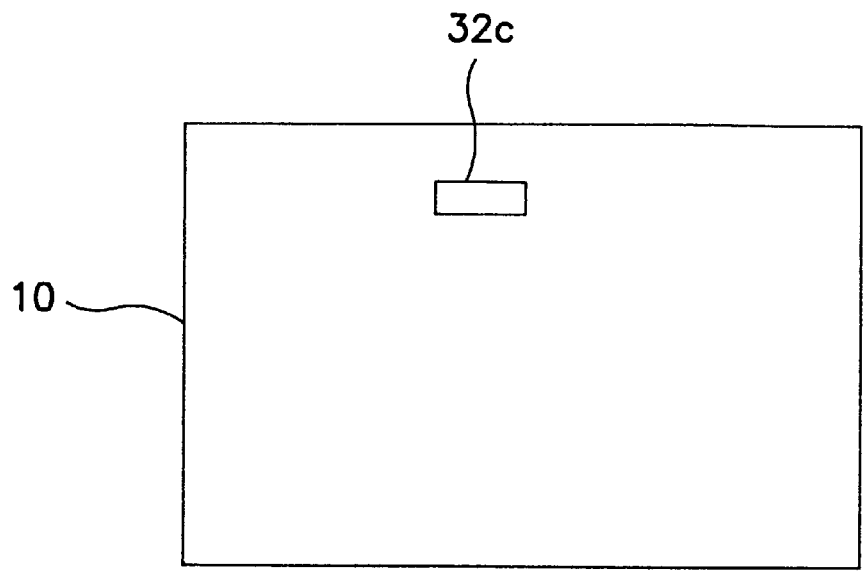
FIG. 4C is a schematic representing the lower level of the low k dielectric layer of the sequence begun in FIG. 4A.

In FIG. 4C, the lower level of the low dielectric constant dielectric pattern 32*c* is deposited to electrically isolate the inductor core material from the conductive coil windings of the inductive device.

Figure 4D:
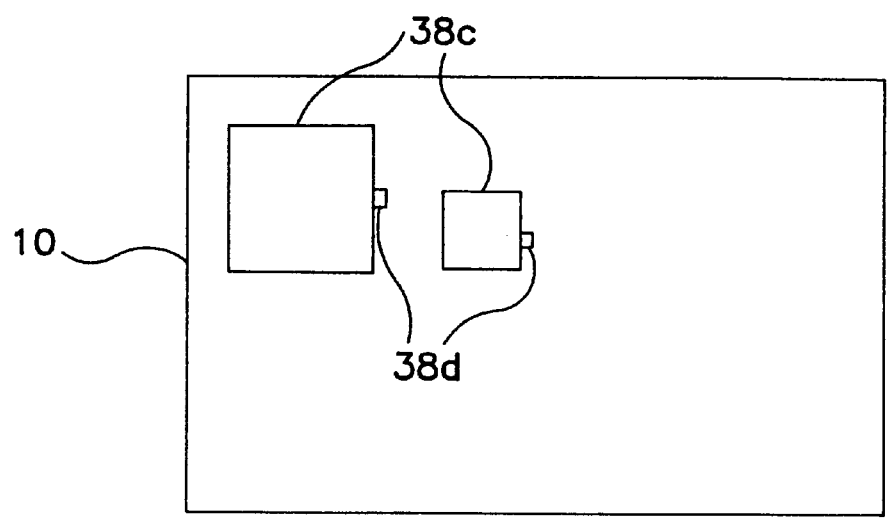
FIG. 4D is a schematic representing the high k dielectric layer of the sequence begun in FIG. 4A.

In FIG. 4D, a high dielectric constant dielectric pattern 38*c* is deposited onto the lower conductive pattern 38*a* of the capacitors. It is important to note that the dielectric material is extended outward to form a high dielectric bond pad insulator 38*d* to provide an electrical isolation between the upper and lower conductive patterns 38*a,e*. This is important because the upper conductive pattern 38*e* is purposefully made smaller in area than the lower conductive pattern 38*a* to avoid fringing effects that might otherwise occur.

Figure 4E:
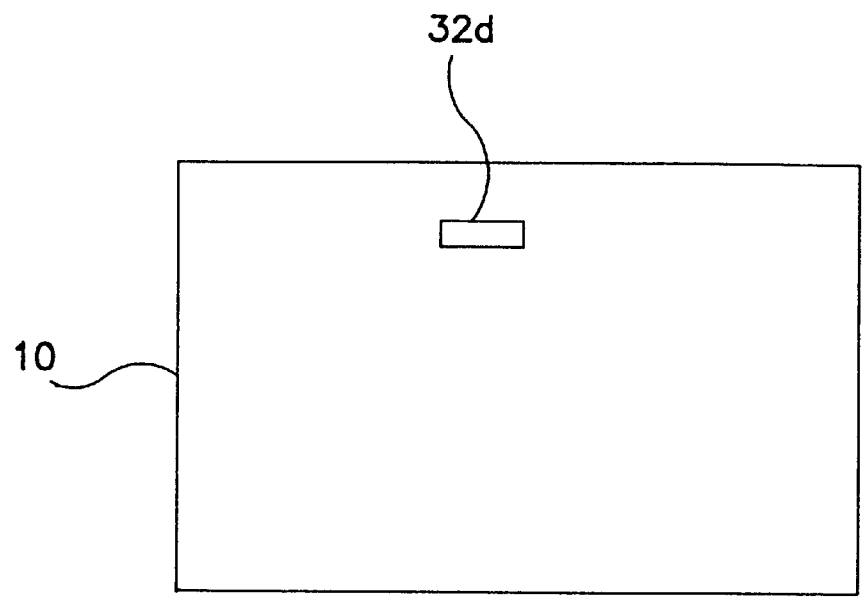
FIG. 4E is a schematic representing the ferrite material layer of the sequence begun in FIG. 4A.

FIG. 4E shows a single deposit of a ferrite pattern 32*d* that forms the core of the inductive device 32.

Figure 4F:
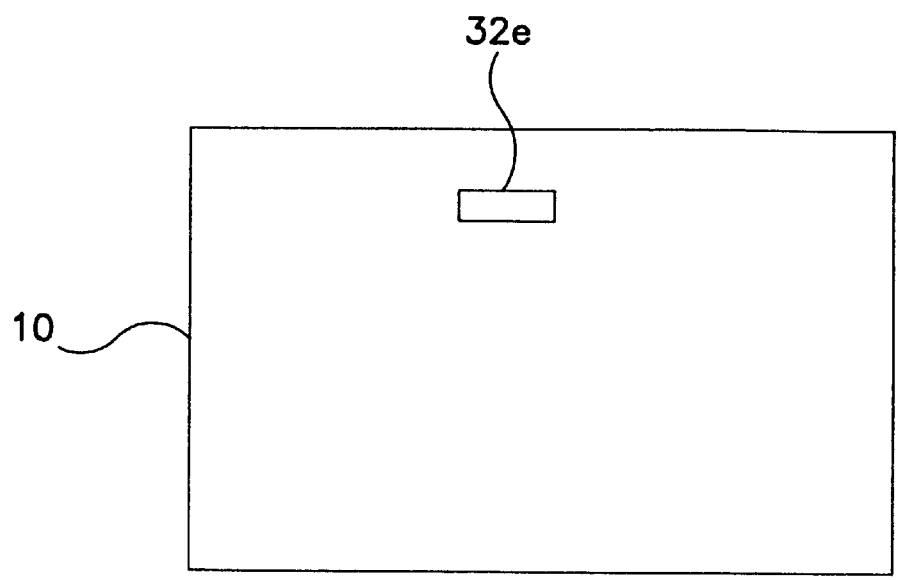
FIG. 4F is a schematic representing the upper level of the low k dielectric layer of the sequence begun in FIG. 4A.
Figure 4G:
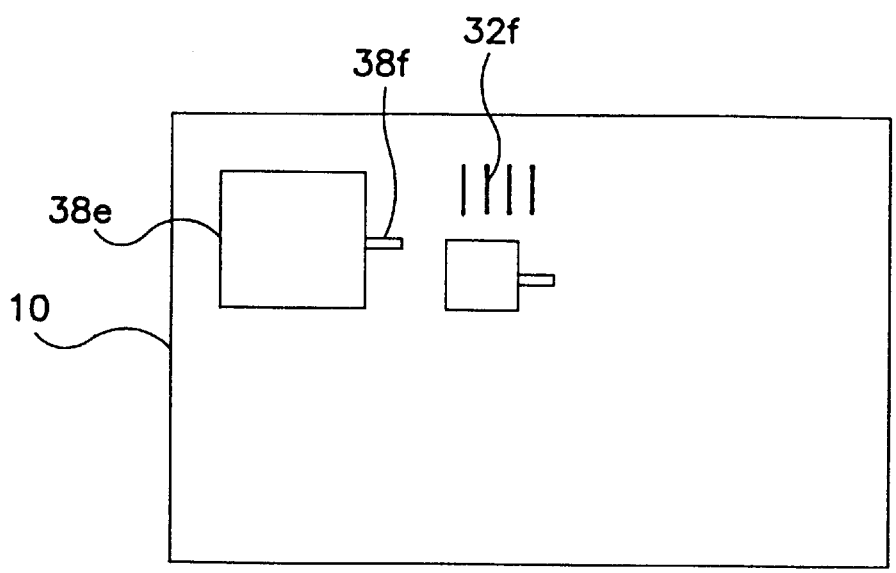
FIG. 4G is a schematic representing the upper capacitive component layer of the sequence begun in FIG. 4A.

FIG. 4F shows the upper level of the low dielectric constant dielectric pattern 32*e* which serves to electrically isolate the ferrite pattern 32*d*, which comprises the inductor core, from the upper coil conductor pattern 32f, shown in FIG. 4G, which forms the upper coil windings of the inductor.

Finally, FIG. 4G shows the final deposition sequence in which a second layer of conductive materials is to be deposited. The upper conductive patterns 38e are applied to the high dielectric constant dielectric pattern 38c of each of the capacitors and a second set of bond/test pads are attached to the upper conductive pattern 38e to form a capacitor component upper bond pad 38f. The upper coil conductor pattern 32f is also deposited such that a single, continuous conductive coil surrounds the electrically isolated magnetic core material.

While this invention has been described as having a preferred embodiment, it is understood that it is capable of further modifications, uses and/or adaptations of the invention, following in general the principle of the invention and including such departures of the present disclosure as come within known or customary practice in the art to which the invention pertains, and as may be applied to the central features set forth herein, and are encompassed by the invention set forth in the following claims.

That which is claimed is:

1. A method for direct material deposition on a substrate, said method comprising:
    (a) passing one or more finely divided feedstocks through an intersection region of a plurality of laser beams under conditions sufficient to convert substantially all of said feedstock into a depositable form, and
    (b) depositing said depositable feedstock on said substrate,
    wherein said finely divided feedstock comprises feedstock particles of less than about 40 $\mu$m in diameter.

2. A method according to claim 1, wherein said depositing is carried out under conditions such that substantially no interfacial damage occurs to either said substrate or said deposited feedstock.

3. A method according to claim 1, wherein energy imparted to said finely divided feedstock by said laser beams is controlled by varying at least one of the time of flight of said finely divided feedstock through said laser beams, the particle size of said finely divided feedstock, the angle of trajectory of said finely divided feedstock, the wavelengths of said laser beams, or the energy of said laser beams.

4. A method according to claim 1, wherein said finely divided feedstock is comprised of charged particles.

5. A method according to claim 4, wherein said feedstock deposition is controllably aimed by passing said charged particle feedstock through one or more electrostatic fields and/or magnetic fields.

6. A method according to claim 1, wherein said feedstock comprises a dielectric material.

7. A method according to claim 1, wherein said feedstock is a resistive material, a conductive material, a semiconductive material, or a magnetic material.

8. A method according to claim 1, wherein said depositable feedstock material is substantially in the liquid phase upon impact with said substrate.

9. A method according to claim 1, wherein said feedstock comprises a combination of two or more different materials.

10. A method according to claim 1, wherein said feedstock, upon impact with said deposition substrate, has both liquid and non-liquid phases.

11. A method according to claim 10, wherein the liquid feedstock interacts with non-liquid feedstock, facilitating aggregation of non-liquid feedstock.

12. A method according to claim 1, wherein said feedstock is deposited in a predetermined pattern.

13. A method according to claim 12, wherein said predetermined pattern comprises an interconnected circuit pattern, including individual electrical components, provided in an electronic format.

14. A method according to claim 13, wherein said electronic format comprises a computer-aided design (CAD) file.

15. A method according to claim 12, wherein deposition of said feedstock in a predetermined pattern is accomplished by controllably aiming said feedstock at said substrate.

16. A method according to claim 15, wherein said controllable aiming is directed by information provided in an electronic format.

17. A method according to claim 15, wherein said aiming of said feedstock material is manually controlled.

18. A method according to claim 15, wherein said controllable aiming directs deposition of said feedstock in a layer-wise manner, whereby multi-layer components can be formed.

19. A method according to claim 1, wherein one or more feedstock materials are selected and deposited under control of information provided in an electronic format.

20. A method according to claim 1, wherein said feedstock material is deposited in a layer-wise manner to create one or more components.

21. A method according to claim 20, wherein said feedstock material comprises two or more different materials.

22. A method according to claim 1, wherein said laser beams are focused approximately parallel to said deposition substrate.

23. A method for direct material deposition on a substrate, said method comprising:
    (a) passing one or more feedstocks from a feedstock source through one or more laser beams under conditions sufficient to both convert substantially all of said feedstock into a depositable form, and to guide said feedstock through one or more hollow fibers disposed between said feedstock source and said substrate, and
    (b) depositing said depositable feedstock on said substrate.

24. A method according to claim 23, wherein said depositing is carried out under conditions such that substantially no interfacial damage occurs to either said substrate or said deposited feedstock.

25. A method according to claim 23, wherein said feedstock is in finely divided particulate form upon entering said one or more laser beams.

26. A method according to claim 25, wherein energy imparted to said finely divided particulate feedstock material by said laser beam is controlled by varying at least one of the time of flight of said finely divided particulate feedstock material through said laser beam, the particle size of said finely divided particulate feedstock material, the angle of trajectory of said finely divided particulate feedstock material, the wavelength of said laser beam, or the energy of said laser beam.

27. A method according to claim 26, wherein a trajectory path of said finely divided particulate feedstock material is selected so that laser energy reflected by some of the particles of the feedstock material is incident onto other particles of the feedstock material within said path.

28. A method according to claim 26, wherein said particles are less than about 40 $\mu$m.

29. A method according to claim 26, wherein said finely divided feedstock is comprised of charged particles.

30. A method according to claim 29, wherein said feedstock deposition is controllably aimed by passing said charged powder feedstock material through one or more electrostatic fields and/or magnetic fields.

31. A method according to claim 23, wherein said feedstock comprises a dielectric material.

32. A method according to claim 23, wherein said feedstock is a resistive material, a conductive material, a semiconductive material, or a magnetic material.

33. A method for direct material deposition on a substrate, said method comprising:
(a) passing one or more feedstocks through an intersection region of a plurality of laser beams under conditions sufficient to convert substantially all of said feedstock into a depositable form,
(b) focusing said depositable feedstock by employing guided laser deposition means, and
(c) depositing said depositable feedstock on said substrate.

34. A method according to claim 33, wherein wherein said depositing is carried out under conditions such that substantially no interfacial damage occurs to either said substrate or said deposited feedstock.

35. A method according to claim 33, wherein said feedstock is in finely divided particulate form upon entering said one or more laser beams.

36. A method according to claim 35, wherein energy imparted to said finely divided particulate feedstock material by said laser beam is controlled by varying at least one of the time of flight of said finely divided particulate feedstock material through said laser beam, the particle size of said finely divided particulate feedstock material, the angle of trajectory of said finely divided particulate feedstock material, the wavelength of said laser beam, or the energy of said laser beam.

37. A method according to claim 36, wherein a trajectory path of said finely divided particulate feedstock material is selected so that laser energy reflected by some of the particles of the feedstock material is incident onto other particles of the feedstock material within said path.

38. A method according to claim 36, wherein said particles are less than about 40 $\mu$m.

* * * * *

UNITED STATES PATENT AND TRADEMARK OFFICE
CERTIFICATE OF CORRECTION

| | | |
|---|---|---|
| PATENT NO. | : 6,251,488 B1 | Page 1 of 1 |
| APPLICATION NO. | : 09/305985 | |
| DATED | : January 26, 2001 | |
| INVENTOR(S) | : W. Doyle Miller et al. | |

It is certified that error appears in the above-identified patent and that said Letters Patent is hereby corrected as shown below:

Column 1, line 11, insert the following paragraph:

--STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. N00014-99-C-0243 awarded by the U.S. Department of the Navy.--

Signed and Sealed this

Fifteenth Day of February, 2011

David J. Kappos
*Director of the United States Patent and Trademark Office*